(12) United States Patent
Shin et al.

(10) Patent No.: US 9,540,744 B2
(45) Date of Patent: Jan. 10, 2017

(54) APPARATUS FOR FABRICATING SILICON CARBIDE SINGLE CRYSTAL INGOT AND METHOD FOR FABRICATING INGOT

(75) Inventors: Dong Geun Shin, Seoul (KR); Chang Hyun Son, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 472 days.

(21) Appl. No.: 14/128,358

(22) PCT Filed: Jun. 20, 2012

(86) PCT No.: PCT/KR2012/004875
§ 371 (c)(1),
(2), (4) Date: Mar. 21, 2014

(87) PCT Pub. No.: WO2012/177048
PCT Pub. Date: Dec. 27, 2012

(65) Prior Publication Data
US 2014/0216330 A1    Aug. 7, 2014

(30) Foreign Application Priority Data
Jun. 20, 2011   (KR) .................. 10-2011-0059861

(51) Int. Cl.
*C30B 23/02*   (2006.01)
*C30B 23/00*   (2006.01)
*C30B 29/36*   (2006.01)

(52) U.S. Cl.
CPC ............. *C30B 23/005* (2013.01); *C30B 23/00* (2013.01); *C30B 29/36* (2013.01)

(58) Field of Classification Search
CPC ....... C30B 23/00; C30B 23/002; C30B 23/005; C30B 23/02; C30B 29/00; C30B 29/10; C30B 29/36; C30B 35/00; C30B 35/002; Y10T 117/00; Y10T 117/10; Y10T 117/1016
USPC ............ 117/84, 88, 102, 200, 204, 937, 951
See application file for complete search history.

(56) References Cited

U.S. PATENT DOCUMENTS

| 3,653,851 A | * | 4/1972 | Gruber ............... B01D 39/2082 |
| | | | 106/482 |
| 2006/0254505 A1 | | 11/2006 | Tsvetkov et al. |
| 2007/0240630 A1 | | 10/2007 | Leonard et al. |
| 2008/0072817 A1 | | 3/2008 | Zwieback et al. |

FOREIGN PATENT DOCUMENTS

JP          10-291899        *   4/1998

OTHER PUBLICATIONS

International Search Report in International Application No. PCT/KR2012/004875, filed Jun. 20, 2012.

* cited by examiner

*Primary Examiner* — Kenneth A Bratland, Jr.
(74) *Attorney, Agent, or Firm* — Saliwanchik, Lloyd & Eisenschenk

(57) ABSTRACT

An apparatus for fabricating an ingot according to the embodiment comprises a crucible for receiving a raw material; and a filter part for selectively filtering a specific component in the crucible, wherein the filter part comprises a polymer.

20 Claims, 2 Drawing Sheets

APPARATUS FOR FABRICATING SILICON CARBIDE SINGLE CRYSTAL INGOT AND METHOD FOR FABRICATING INGOT

CROSS-REFERENCE TO RELATED APPLICATIONS

This application is the U.S. national stage application of International Patent Application No. PCT/KR2012/004875, filed Jun. 20, 2012, which claims priority to Korean Application No. 10-2011-0059861, filed Jun. 20, 2011, the disclosures of each of which are incorporated herein by reference in their entirety.

TECHNICAL FIELD

The disclosure relates to an apparatus for fabricating an ingot and a method for fabricating an ingot.

BACKGROUND ART

In general, materials are very important factors to determine the property and the performance of final products in the electric, electronic and mechanical industrial fields.

SiC represents the superior thermal stability and superior oxidation-resistance property. In addition, the SiC has a superior thermal conductivity, so the SiC can be used for fabricating a large-size substrate having a diameter of about 2 inches or above. In particular, the single crystal growth technology for the SiC is very stable actually, so the SiC has been extensively used in the industrial field as a material for a substrate.

In order to grow the single crystal for SiC by using a seed, a seeded growth sublimation scheme has been suggested. In this case, after putting SiC powder serving as a raw material in a crucible, an SiC single crystal serving as a seed is provided over the raw material. In addition, the temperature gradient is formed between the raw material and the seed, so that the raw material in the crucible is diffused toward the seed and recrystallized to grow a single crystal.

When a single SiC crystal is grown, carbon impurities and contaminants come from a raw material used to grow an SiC single crystal are introduced into the single SiC crystal, so that the single SiC crystal may be defected.

DISCLOSURE OF INVENTION

Technical Problem

The embodiment can grow a high-quality single crystal.

Solution to Problem

An apparatus for fabricating an ingot according to the embodiment comprises a crucible for receiving a raw material; and a filter part for selectively filtering a specific component in the crucible, wherein the filter part comprises a polymer.

Advantageous Effects of Invention

An apparatus for fabricating the ingot according to the first embodiment comprises a filter part. Since the filter part is placed on a raw material, a surface of the raw material may be maintained in a flat state and the impurities which may be introduced into the raw material may be blocked. In addition, the filter part may control a sublimation rate of the raw material in an initial growth stage, so that the high-quality single crystal may be grown.

The filter part may have a fibrous structure. That is, since the filter part has a continuous fibrous structure, necking (chemical bonding) is formed between fibers. Therefore, the durability of the filter part may be improved, and the filter part may be prevented from being damaged during a single crystal growth process. In addition, the filter part is easily manipulated, so that the process efficiency may be improved. Further, silicon carbide gas required for growing the single crystal may be uniformly supplied to a seed, and an amount of silicon carbide gas supplied per time may be increased. Thus, the growing rate of the single crystal may be improved.

In addition, the filter part may selectively filter a specific component. In detail, materials sublimated from the raw material may comprise $SiC_2$, $Si_2C$, $Si$ and carbon impurities, and the filter part may adsorb the carbon impurities. That is, the carbon impurities generated from the raw material may be prevented from participating in the process of growing the single crystal. Although the single crystal may be defective when the carbon impurities move to the single crystal, the filter part may prevent the single crystal from being defective.

An apparatus for fabricating an ingot according to the second embodiment comprises a filter part including two layers, and sizes of pores formed in the two layers are different from each other. That is, fibers having at least two types of size distribution may be prepared in the layered structure.

Thus, impurity penetration into the single crystal may be diminished. Further, the maximum gas permeability may be ensured.

MODE FOR THE INVENTION

Figure 1:
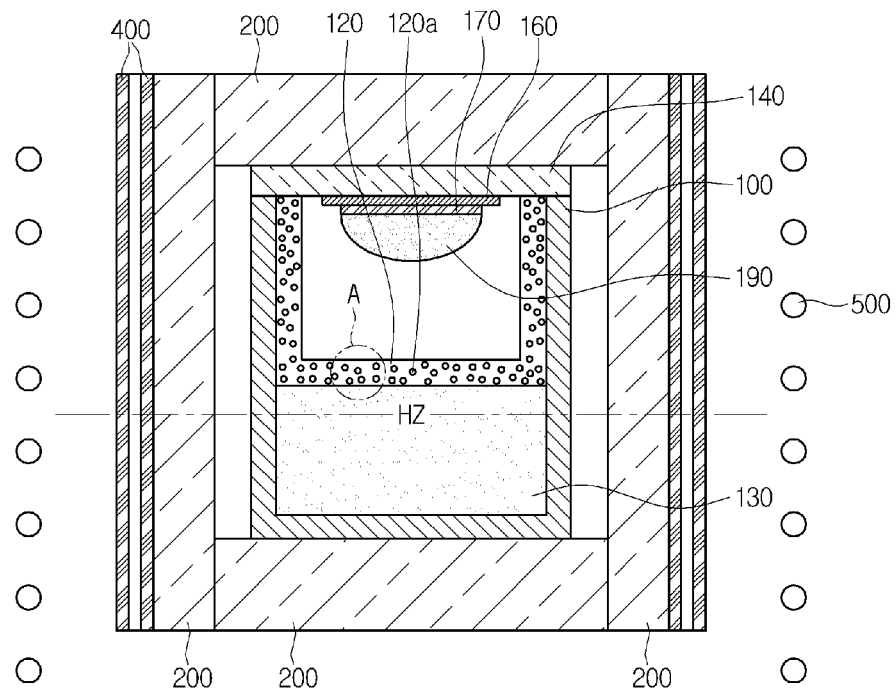
FIG. 1 is a sectional view of an apparatus for fabricating an ingot according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or over the other substrate, layer (or film), region, pad, or pattern, or one or more intervening layers may also be present. Such a position of the layer has been described with reference to the drawings.

Since the thickness and size of each layer shown in the drawings may be modified for the purpose of convenience or clarity of description, the size of elements does not utterly reflect an actual size.

Hereinafter, the embodiments of the present invention will be described with reference to accompanying drawings.

Figure 2:
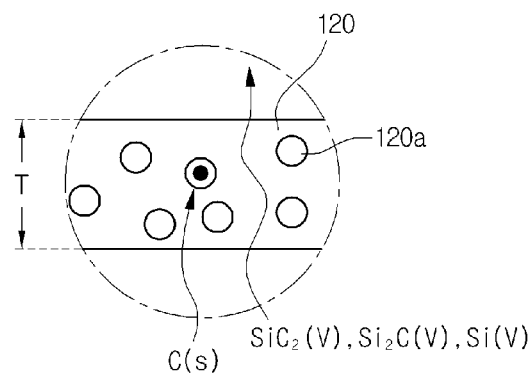
FIG. 2 is an enlarged sectional view showing a part 'A' of FIG. 1.

An apparatus for fabricating an ingot according to the first embodiment will be described in detail with reference to FIGS. 1 and 2. FIG. 1 is a sectional view of the apparatus for fabricating the ingot according to the first embodiment. FIG. 2 is an enlarged sectional view showing the part 'A' of FIG. 1.

Referring to FIG. 1, the apparatus 10 for fabricating the ingot according to the first embodiment comprises a crucible 100, a raw material 130, a filter part 120, an upper cover 140, a seed holder 160, a thermal insulator 200, a quartz tube 400, and a heat generation induction part 500.

The crucible 100 may receive the raw material 130 therein.

The crucible 100 may have a cylindrical shape, such that the inner crucible 100 can receive the raw material 130.

The crucible 100 may comprise a material having a melting point equal to or higher than the sublimation temperature of silicon carbide.

For example, the crucible 100 may be formed using graphite.

Further, a material having a melting point equal to or higher than the sublimation temperature of silicon carbide may be coated on the graphite of the crucible 100. A material chemically inactive with silicon and hydrogen at the temperature at which silicon carbide single crystal is grown is preferably used as the material coated on the graphite. For example, metal carbide or metal nitride may be used. Specifically, a mixture including at least two of Ta, Hf, Nb, Zr, W and V and carbide including carbon may be coated. Further, a mixture including at least two of Ta, Hf, Nb, Zr, W and V and nitride including nitrogen may be coated.

The raw material 130 may comprise silicon and carbon. In detail, the raw material 130 may be a compound including silicon, carbon, oxygen, and hydrogen. The raw material 130 may be silicon carbide (SiC) powder or polycarbosilane.

Then, the filter part 120 may be placed in the crucible 100. In detail, the filter part 120 may be placed on the raw material 130. Further, as shown in FIG. 1, the filter part 120 may be formed along an inner wall of the crucible 100.

The filter part 120 may comprise polymer. In detail, the filter part 120 may have a fibrous structure.

Since the filter part 120 has a continuous fibrous structure, necking (chemical bonding) is formed between fibers. Therefore, the durability of the filter part 120 may be improved, and the filter part 120 may be prevented from being damaged during a single crystal growth process. In addition, the filter part 120 is easily manipulated, so that the process efficiency may be improved. Further, silicon carbide gas required for growing the single crystal may be uniformly supplied to a seed 170, and an amount of silicon carbide gas supplied per time may be increased. Thus, the growing rate of the single crystal 190 may be improved.

The filter part 120 may be porous. That is, the filter part 120 may comprise a plurality of pores 120a. In detail, the filter part 120 may comprise an inter-fiber pore which is formed in various thicknesses ranging from 0.1 μm to 30 μm. Further, the filter part 120 may comprise a fiber-surface pore.

Referring to FIG. 2, the pores 120a may adsorb carbon impurities and contaminants having very fine sizes. Further, the filter part 120 may allow $SiC_2$, $Si_2C$ and Si to pass therethrough, so that $SiC_2$, $Si_2C$ and Si may move to the seed 170.

The filter part 120 may be placed such that the distance from the crucible 100 is minimized. Thus, the filter part 120 may filter impurities as much as possible.

The filter part 120 may have a thickness T in the range of 1 mm to 10 cm. The thickness T of the filter part 120 may be selected according to the size of the crucible 100 and the scale of the crucible 100. If the filter part 120 has a thickness T less than 1 mm, the thickness T is so thin that it is difficult to adsorb the carbon impurities. If the filter part 120 has the thickness T exceeding 10 cm, the thickness T is so thick that the filtering rate of materials other than carbon impurities may be lowered. That is, the filtering rate of silicon carbide gas used to grow the single crystal 190 may be lowered. Thus, the growth rate of the single crystal 190 may be lowered.

The filter part 120 may comprise a membrane. In detail, the filter part 120 may be a membrane of a fibrous structure.

Since the filter part 120 has a fibrous structure, the filter part 120 may be manufactured through one of a melt-spinning scheme, a melt-blown scheme, and an electrospinning scheme. That is, the filter part 120 may be implemented by performing a fiber spinning process, a fiber loading process, and a heat treatment process of the loaded fiber. However, the embodiment is not limited thereto, and the fibrous filter part 120 may be manufactured through various schemes.

Since the filter part 120 is placed on the raw material 130, the surface of the raw material 130 may be planarized and the impurities, which may be introduced into the raw materials 130, can be blocked. In addition, the filter part 120 controls the sublimation rate of the raw materials 130 in the initial growth stage, so that the high-quality single crystal can be grown.

In addition, the filter part 120 may selectively filter a specific component. In detail, the filter part 120 may adsorb carbon impurities and contaminants. That is, the carbon impurities, which come from the raw material, may be prevented from participating in the process of growing the single crystal 190. When the carbon impurities move to the single crystal 190, the single crystal 190 may be defective.

The upper cover 140 may be placed at an upper portion of the crucible 100. The upper cover 140 may seal the crucible 100. The upper cover 140 may comprise graphite.

The seed holder 160 is placed at a lower end portion of the upper cover 140. The seed holder 160 may fix the seed 170. The seed holder 160 may comprise high-concentration graphite.

The seed 170 is attached to the seed holder 160. The single crystal 190 can be prevented from being grown to the upper cover 140 by attaching the seed 170 to the seed holder 160. However, the embodiment is not limited thereto, and the seed 170 may be directly attached to the top cover 140.

The thermal insulator 200 surrounds the crucible 100. The thermal insulator 200 keeps the crucible 100 at the crystal growth temperature. Since the crystal growth temperature of silicon carbide is very high, graphite felt may be used for the thermal insulator 200. In detail, the graphite felt used for the thermal insulator 200 may be manufactured in a cylindrical shape with a predetermined thickness by pressing a graphite fiber. Further, the thermal insulator 200 may be formed in a plurality of layers, so that the first thermal insulator 200 may surround the crucible 100.

The quartz tube 400 is placed at a peripheral surface of the crucible 100. The quartz tube 400 is fitted around the peripheral surface of the crucible 100. The quartz tube 400 may prevent heat from transferring from the heat generation induction part 500 to the inside of the single crystal growth apparatus. The quartz tube 400 may be a hollow pipe having an empty inner space. Cooling water may be circulated through the inner space of the quartz tube 400.

The heat generation induction part 500 is placed out of the crucible 100. For example, the heat generation induction part 500 may be a high frequency induction coil. The crucible 100 may be heated as a high frequency current flows through the high frequency induction coil. That is, the raw material, which is received in the crucible 100, may be heated at the desired temperature.

The central portion of the heat generation induction part 500, which is induction heated, is formed at a position lower than the central portion of the crucible 100. Thus, the temperature gradient may be formed in the crucible 100 such that an upper portion and a low portion of the crucible 100 may have temperatures different from each other. That is, a hot zone (HZ), which is the center of the heat generation induction part 500, is located at a low position relative to the center of the crucible 100 so that the temperature of the low portion of the crucible 100 is higher than that of the upper portion of the crucible 100 about the hot zone (HZ). Further, the temperature becomes high from the central portion to the outer peripheral portion of the crucible 100. Due to the temperature gradient, the silicon carbide raw material 130 is sublimated and the sublimated silicon carbide gas moves to a surface of the seed 170 having the relatively low temperature. Thus, the silicon carbide gas is grown in a single crystalline structure through the re-crystallization.

Hereinafter, an apparatus for fabricating an ingot according to the second embodiment will be described with reference to FIGS. 3 and 4. In the following description, for the purpose of clear and simple explanation, the details of structures and components the same as or similar to those of the first embodiment will be omitted.

Figure 3:
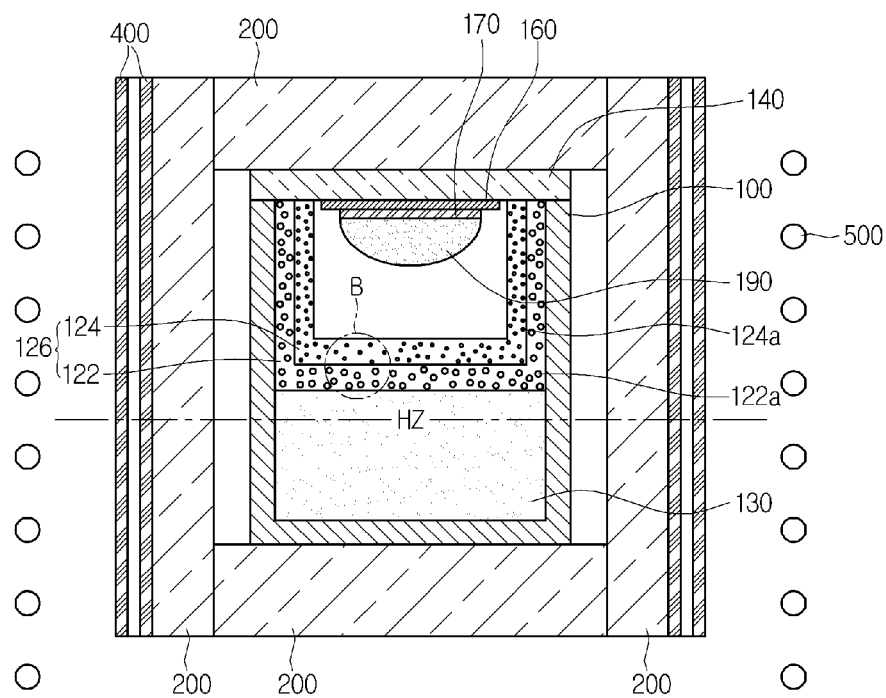
FIG. 3 is a sectional view of an apparatus for fabricating an ingot according to the second embodiment.
Figure 4:
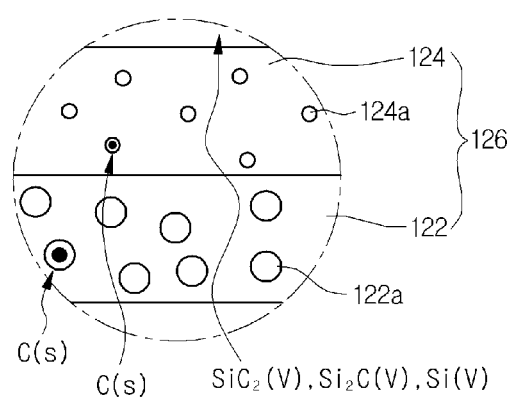
FIG. 4 is an enlarged sectional view showing a part 'B' of FIG. 3.

FIG. 3 is a sectional view of the apparatus for fabricating the ingot according to the second embodiment. FIG. 4 is an enlarged sectional view showing the part 'B' of FIG. 3.

The apparatus 20 for fabricating the ingot according to the second embodiment comprises a filter part 126. The filter part 126 comprises a first layer 122 and a second layer 124 on the first layer 122.

The first and second layers 122 and 124 may comprise a plurality of pores 122a and 124a. The sizes of the plurality of pores 122a and 124a comprised in the first and second layers 122 and 124 may be different from each other.

In detail, a size of a pore 122a comprised in the first layer 122 may be greater than that of a pore 124a comprised in the second layer 124.

The first layer 122 may filter carbon particles having large sizes and impurities which exist in the raw material 130 at the initial growth stage. The second layer 124 may filter micro carbon impurities and various contaminants passing through the first layer 122.

That is, the filter part 126 may be formed as the layered structure by using fibers having at least two types of size distribution.

In the apparatus for fabricating the ingot according to the second embodiment, the filter part 126 comprises two layers, so that impurity penetration into the single crystal 190 may be diminished. Further, the maximum gas permeability may be ensured.

The porosities of the pores 122a and 124a comprised in the first and second layers 122 and 124 may be equal to or different from each other.

Although it has been described that the filter part 126 of the apparatus for fabricating the ingot according to the second embodiment comprises two layers, the embodiment is not limited thereto. Thus, the filter part 126 may comprise at least two layers having various pore sizes.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. An apparatus for fabricating a silicon carbide single crystal ingot, the apparatus comprising:
   a crucible receiving a raw material;
   a filter part selectively filtering a specific component of the raw material into the crucible,
   wherein the filter part comprises a first filter member on the raw material and a second filter member surrounding an inner wall of the crucible, and the first filter member and the second filter member are integrally formed with each other,
   wherein the second filter member is disposed on the raw material,
   wherein the filter part comprises a first layer and a second layer on the first layer,
   wherein the filter part is porous,
   wherein a size of pores of the first layer is different from a size of pores of the second layer, and
   wherein the specific component passing through the filter part comprises $SiC_2$, $Si_2C$, or Si.

2. The apparatus of claim 1, wherein the filter part has a fibrous structure.

3. A method for fabricating a silicon carbide single crystal ingot, the method comprising:
   preparing a crucible receiving a raw material;
   preparing a filter part selectively filtering a specific component of the raw material into the crucible; and
   growing an ingot from the raw material,
   wherein the raw material passes through the filter part during the growing of the ingot,
   wherein the filter part comprises a first filter member on the raw material and a second filter member surrounding an inner wall of the crucible, and the first filter member and the second filter member are integrally formed with each other,
   wherein the second filter member is disposed on the raw material,
   wherein the filter part comprises a first layer and a second layer on the first layer,
   wherein the filter part is porous,
   wherein a size of pores of the first layer is different from a size of pores of the second layer,
   wherein the specific component passing through the filter part comprises $SiC_2$, $Si_2C$, or Si, and
   wherein the ingot comprises a silicon carbide single crystal ingot.

4. The method of claim 3, wherein the filter part has a fibrous structure.

5. The apparatus of claim 1, wherein the filter part has a thickness in a range of 1 mm to 10 cm.

6. The apparatus of claim 1, wherein the filter part comprises a membrane.

7. The apparatus of claim 1, wherein the size of the pores of the first layer is greater than the size of the pores of the second layer.

8. The apparatus of claim 1, wherein the crucible comprises graphite.

9. The apparatus of claim 8, wherein a coating material is applied onto the graphite of the crucible, and wherein the coating material has a melting point equal to or higher than a sublimation temperature of silicon carbide.

10. The apparatus of claim 9, wherein the coating material comprises metal carbide or metal nitride.

11. The apparatus of claim 1, wherein the raw material comprises silicon and carbon.

12. The apparatus of claim 1, wherein the filter part comprises a plurality of pores, and wherein sizes of the plurality of pores of the filter part are in a range of 0.1 μm to 30 μm.

13. The apparatus of claim 1, wherein the filter part adsorbs carbon impurities and contaminants.

14. The apparatus of claim 1, wherein an upper cover is disposed at an upper portion of the crucible.

15. The apparatus of claim 14, wherein the upper cover comprises graphite.

16. The apparatus of claim 14, wherein a seed holder is disposed at a lower end portion of the upper cover, and wherein the seed holder comprises graphite.

17. The apparatus of claim 1, wherein a thermal insulator surrounds the crucible, and wherein the thermal insulator comprises a plurality of layers.

18. The apparatus of claim 1, wherein a quartz tube is disposed on a peripheral surface of the crucible, and wherein the quartz tube has a hollow pipe shape with an empty inner space.

19. The apparatus of claim 1, wherein a heat generation induction part is disposed out of the crucible.

20. The apparatus of claim 19, wherein a central portion of the heat generation induction part, which is induction heated, is formed at a position lower than a central portion of the crucible.

* * * * *